United States Patent

Walczyk

[11] Patent Number: 5,428,233
[45] Date of Patent: Jun. 27, 1995

[54] VOLTAGE CONTROLLED RESISTIVE DEVICE

[75] Inventor: Frederick W. Walczyk, Round Rock, Tex.

[73] Assignee: Motorola Inc., Schaumburg, Ill.

[21] Appl. No.: 222,064

[22] Filed: Apr. 4, 1994

[51] Int. Cl.$^6$ .................... H01L 29/732; H01L 29/772
[52] U.S. Cl. ...................................... 257/273; 257/552; 257/570
[58] Field of Search ........................ 257/273, 552, 570

[56] References Cited

U.S. PATENT DOCUMENTS

| | | | |
|---|---|---|---|
| 4,066,917 | 1/1978 | Compton | 257/273 |
| 4,322,738 | 3/1982 | Bell et al. | 257/22 |
| 4,373,253 | 2/1983 | Khadder et al. | 29/576 |
| 4,549,193 | 10/1985 | Malhi et al. | 357/22 |
| 4,835,596 | 5/1989 | Werner | 257/273 |
| 5,068,705 | 11/1991 | Tran | 357/43 |

Primary Examiner—Jerome Jackson
Attorney, Agent, or Firm—Jasper W. Dockrey

[57] ABSTRACT

A voltage controlled resistive device is provided by coupling a vertical bipolar transistor (34) with a junction field effect transistor (36) through a well region 18, which functions as both a drain region for the junction field effect transistor (36), and as a collector region for the vertical bipolar transistor (34). The voltage controlled resistive device of the invention provides a means of varying the output current of the vertical bipolar transistor (34) by application of a variable voltage level to the gate region (26) of the junction field effect transistor (36). To obtain proper junction bias characteristics and a compact device size, the source region (24), the gate region (26) of the junction field effect transistor (36), and the base region (22) of the vertical bipolar transistor (34) are formed in a single well region (18) of a semiconductor substrate (10).

8 Claims, 3 Drawing Sheets

VOLTAGE CONTROLLED RESISTIVE DEVICE

FIELD OF THE INVENTION

This invention relates in general to semiconductor devices, and more particularly to junction field effect transistors in association with bipolar devices and MOS devices.

BACKGROUND OF THE INVENTION

Vertical bipolar transistors are widely employed in semiconductor devices, because they offer high operating speeds and high current gain. A vertical bipolar transistor can be fabricated in a small substrate area because the elements of the bipolar transistor can be formed as layers of semiconductor material, thereby taking advantage of the vertical dimensions of a semiconductor substrate. The ability to fabricate many bipolar devices in a small surface area makes the vertical bipolar transistor an ideal circuit element in combination with metal-oxide-semiconductor (MOS) devices. Vertical bipolar transistors are widely used in switching devices and as current sources in complex bipolar-complementary-MOS (BiCMOS) integrated circuits.

Vertical bipolar transistors can be fabricated to have extremely high current gain by fabricating a very thin base region in the device. High output current is achieved by a small variation in voltage of the base region. By varying the base voltage, the vertical bipolar transistor is set to an on-state, an intermediate state, or an off-state. Thus by small changes in base voltage, the vertical bipolar transistor produces either a large amount of electrical current output, an intermediate amount of current, or alternatively, under ideal conditions, no output current at all. The on/off characteristics of the vertical bipolar device make this device suitable for application in digital devices, and for coupling to other digital circuits using MOS devices.

While the vertical bipolar transistor provides a high output current in digital applications, complex semiconductor devices also require the fabrication of resistive elements for the regulation of electrical current in the device. Typically, resistive elements are provided by forming regions of semiconductor material having a controlled resistivity ranging from a high near intrinsic resistivity to very low resistivity. Additionally, resistive devices can also be created through fabrication of MOS load transistors. The load transistors resist the flow of current when proper voltage levels are applied to the terminals of the load transistor to place the transistor in an off-state. In the case of either a load transistor, or a layer of resistive semiconductor material, a single level of resistance is provided. Neither the MOS load transistor nor the semiconductor resistor is capable of assuming a uniformly variable resistance value. Therefore, when coupling conventional resistive elements to a high current source, such as a vertical bipolar transistor, only a single resistive level can be attained.

Although circuit elements, such as a vertical bipolar transistor and an MOS transistor conventionally, operate as switches in either an on-state or an off-state, the need for variable current levels often arises in the design of complex semiconductor devices. Numerous types of semiconductor devices benefit from variable resistance current sources, such as multi-state logic devices, operational amplifiers, analog-digital converters, and digital signal processing devices, and the like. Accordingly, further development is necessary to enable the fabrication of vertical bipolar devices having voltage controlled variable current output.

SUMMARY OF THE INVENTION

In practicing the present invention there is provided a voltage controlled resistive device, which includes a vertical bipolar transistor integrated with a junction field effect transistor. The bipolar transistor and the junction field effect transistor share a common well region, which functions as both a drain region for the junction field effect transistor, and as a collector region for the bipolar transistor. The voltage controlled resistive device resides in a substrate having a device layer overlying a buried region. A well region resides within the device layer and a base region resides within the well region. The vertical bipolar transistor includes a base region within the well region, and a buried layer residing in the well region. The junction field effect transistor also resides within the well region. The well region functions both as a drain region for the junction field effect transistor, and as a collector region for the bipolar transistor.

In operation, the bipolar transistor provides a current source to the junction field effect transistor. The junction field effect transistor then regulates the output current of the bipolar transistor to discrete values depending upon the voltage level applied to the gate electrode of the junction field effect transistor.

Figure 1:
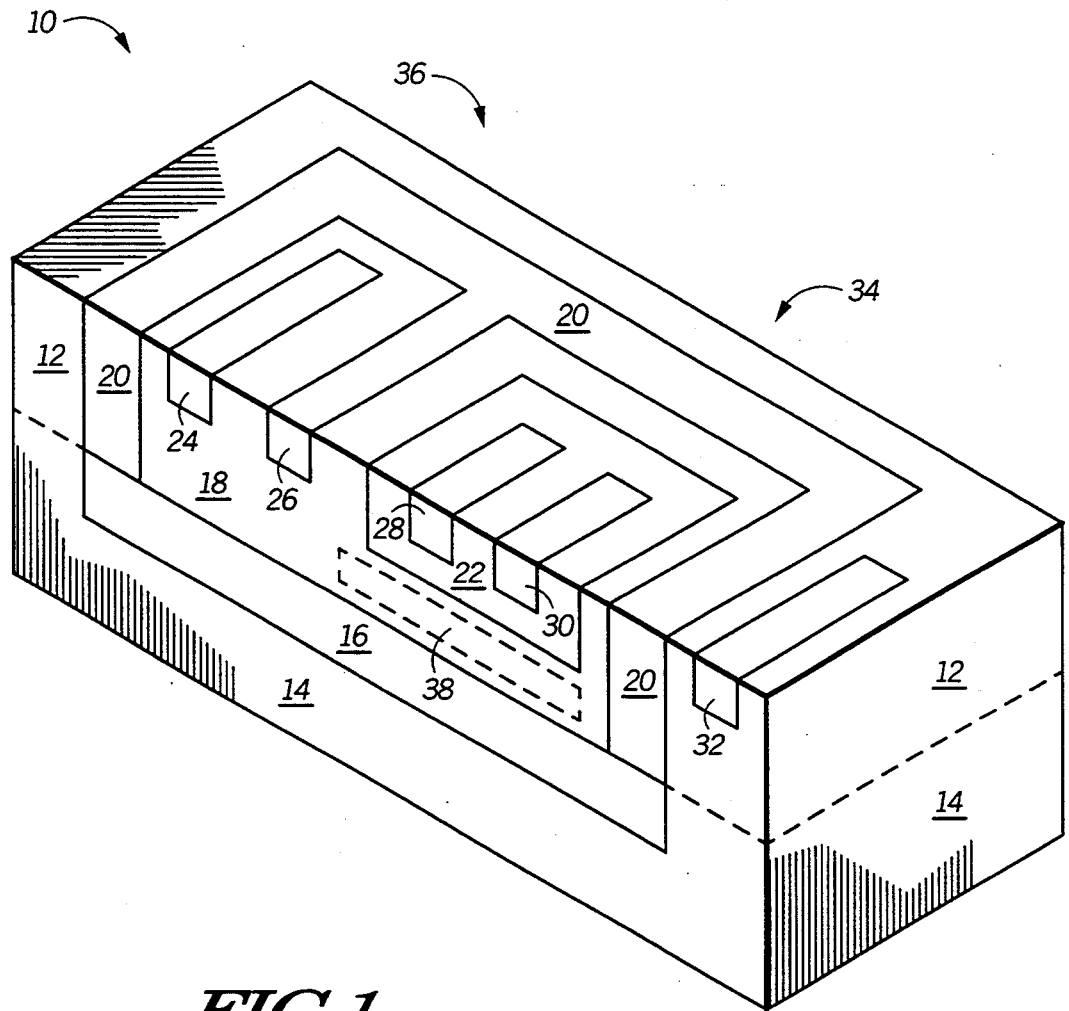
FIG. 1 illustrates, in perspective view, the voltage controlled resistive device of the invention.

It will be appreciated that for simplicity and clarity of illustration, elements shown in the FIGURES have not necessarily been drawn to scale. For example, the dimensions of some of the elements are exaggerated relative to each other for clarity. Further, where considered appropriate, reference numerals have been repeated among the FIGURES to indicate corresponding elements.

DETAILED DESCRIPTION OF THE PREFERRED EMBODIMENTS

The present invention provides an electrically controllable resistor element coupled with a vertical bipolar transistor. A variable electrical resistance is obtained through the fabrication of a junction field effect transistor having a doped region, which functions both as a drain region for the junction field effect transistor, and as a collector region for the bipolar transistor. The utilization of a single doped region serving as both a drain region and as a collector region, enables an a junction field effect transistor (JFET) to be integrated with a bipolar transistor. The combination can be used in a high-performance semiconductor device, such as a BiCMOS memory device, and the like.

Because the current-voltage characteristics of the well region change as a function of the voltage applied to the gate region, the JFET can function as a variable resistor element, wherein the resistance is controlled by the voltage applied to the gate region. By coupling the variable resistance capability of a junction field effect transistor to a bipolar device having high output current, a device component is created having output characteristics similar to an analog device. Numerous applications for the voltage controlled resistive device of the invention exist; including but not limited to, operational amplifiers, analog-digital converters, digital signal processing circuits, high-density random access memory cells, and the like.

Shown in FIG. 1, in perspective view, is a portion of a semiconductor substrate 10 in which a junction field effect transistor 36 is electrically coupled to a vertical bipolar transistor 34. Substrate 10 includes a device layer 12 overlying a buried region 14. A buried layer 16 resides in buried region 14 and separates a well region 18 from buried region 14. An isolation region 20 extends from buried layer 16 to the surface of device layer 12. Isolation region 20 electrically isolates well region 18 from the remaining portions of substrate 10. A base region 22 resides within well region 18, and a source region 24 resides within well region 18 and is separated from base region 22 by a gate region 26. As depicted in FIG. 1, gate region 26 is integral with isolation region 20. A doped region 28 and a base contact 30 reside within base region 22. A substrate contact 32 resides in device layer 12, wholly outside of well region 18.

Doped region 28, base region 22, and well region 18 comprise the emitter, base, and collector of a vertical bipolar transistor 34, respectively. Also, source region 24, gate region 26, and well region 18, comprise the source, gate, and drain, respectively, of a junction field effect transistor 36. In accordance with the invention, doped region 28 functions as both a drain region for JFET 36 and as a collector region for bipolar transistor 34. Substrate contact 32 provides a site to apply a bias voltage to substrate 10. A second buried layer 38 can be optionally included to reduce electrical resistance in the channel region of JFET 36.

The electrodes of the voltage controlled resistive device include source, gate, and drain regions, 24, 26, and 18, respectively, of JFET 36 and doped region 28 and base region 30, of bipolar transistor 34. All the terminals of the voltage controlled resistive device are contained within a first perimeter formed by buried layer 16 and isolation region 20. In addition, the doped region 28 and base region 30 are contained within a second perimeter defined by base region 22 within well region 18. Thus, the voltage controlled resistive device of the invention is a junction isolated device having a compact geometric configuration. In part, because of the junction isolation features of the device, the invention can be easily integrated into a wide variety of integrated circuits and discrete devices.

Although the device structure illustrated in FIG. 1 shows a single junction field effect transistor coupled to a single bipolar transistor, those skilled in the art will appreciate that in a complex integrated circuit device many of the transistors illustrated in FIG. 1 will reside in various portions of an circuit. Additionally, when the device of the invention is incorporated into, for example, a BiCMOS device, n-channel and p-channel MOS transistors will also reside in adjacent portions of substrate 10.

Figure 2:
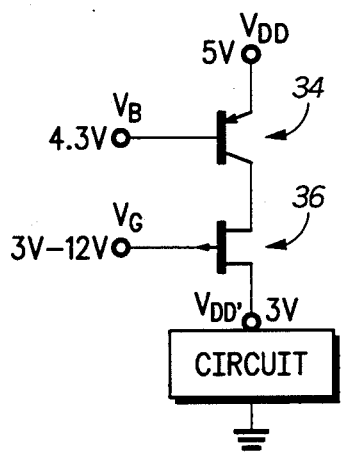
FIG. 2 is a schematic diagram illustrating the circuit components of the voltage controlled resistive device of the invention.

FIG. 2 illustrates a schematic diagram of the voltage controlled resistive device of the invention. The schematic diagram illustrates one embodiment of the invention, in which bipolar transistor 34 has a p-n-p conductivity, and JFET 36 has p-channel conductivity. In the embodiment illustrated in FIG. 2, source region 24 and doped region 28 have p-type conductivity and gate region 26 has n-type conductivity. Also, base region 22 has n-type conductivity, and well region 18 has p-type conductivity. Operating voltages of the four terminals of thee device are shown for this particular conductivity relationship.

As illustrated in FIG. 2, a variable voltage between about 3 volts to 12 volts can be applied to the gate of JFET 36 to provide a variable current at source 24. Bipolar transistor 34 functions as a current source to JFET 36. The variable output current is then supplied from bipolar transistor 34, through JFET 36, to a circuit element residing in a portion of substrate 10. Those skilled in the art will appreciate that the conductivity in both the bipolar transistor and the junction field effect transistor can be reversed, in which case the voltages illustrated in FIG. 2 will have negative values.

Figure 3:
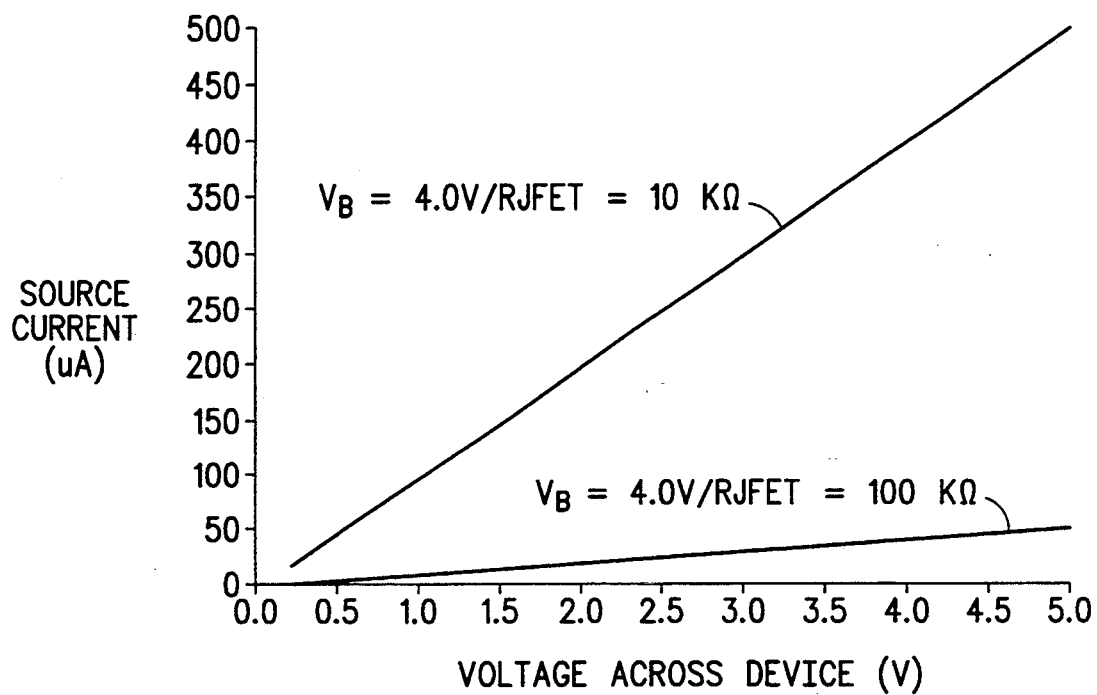
FIG. 3 is a plot of source current as a function of the voltage applied across the device for different JFET resistance values.

An illustrative example of the current-voltage characteristics of voltage controlled resistive device is shown in FIG. 3. The current-voltage plot indicates that as the voltage across the device is increased, the source current correspondingly increases. The voltage applied to the gate region of the JFET determines the resistance value of the JFET and changes the current-voltage characteristic of the device. The plot shown in FIG. 3 illustrates the current-voltage characteristics of the device for different base-emitter voltages and JFET resistance values.

The resistance value of the JFET changes because the voltage applied to gate region 26 varies the dimensions of the conductive JFET channel located in well region 18. Referring to the JFET construction illustrated in FIGS. 1 and 2, when a high positive voltage level is applied to gate region 26, the JFET conductive channel region is reduced in cross-sectional area by the enlargement of depletion regions (regions depleted of mobile charge carriers). The depletion regions extend into the conductive channel from both gate region 26 and from buried layer 16. Conversely, for small positive gate voltages, the depletion regions contract and a larger quantity of charge carriers is available to support current flow through the channel. Accordingly, when operated in this manner, the JFET 36 controls the current from the bipolar transistor 34, and hence the output current from the voltage controlled resistive device.

FIGS. 4–9 illustrate, in cross-section, process steps for fabricating the voltage controlled resistive device of the invention. In the following fabrication sequence, a process is described for the formation of a p-channel JFET and an n-p-n bipolar transistor. However, the formation of a JFET and a bipolar transistor having an opposite conductivity type is within the scope of the invention. Additionally, the process is described for the fabrication of a voltage controlled resistive device in a silicon substrate. However, other semiconductor materials such as gallium arsenide and germanium are within the scope of the invention. Furthermore, other device components such as MOS transistors, and the like, can be formed concurrently with the process steps described below. An important aspect of the present invention includes the compatibility of the preferred process for fabricating the device of the invention with processing steps commonly employed for the fabrication of MOS devices. Because of the compatibility of process steps, the voltage controlled resistive device of the invention can be fabricated in a BiCMOS process without the burden of adding additional steps to the BiCMOS process.

Figure 4:
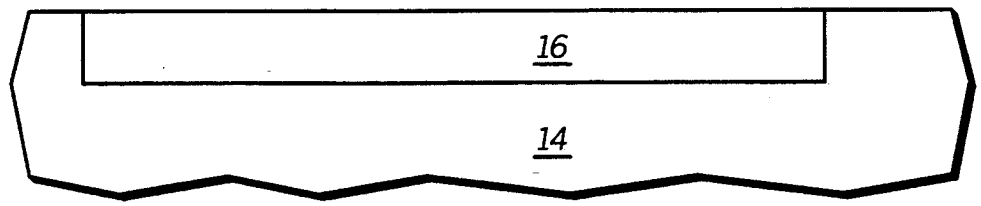
FIGS. 4–8 illustrate, in cross-section, process steps in accordance with one embodiment for the fabrication of the voltage controlled resistive device of the invention.

The process begins as illustrated in FIG. 4. Shown, in cross-section, is a portion of a silicon substrate 10 in which a buried layer 16 resides at the surface of a buried region 14. Buried region 14 is preferably p-type single crystal silicon having a doping concentration of about $1\times10^{15}$ to $5\times10^{16}$ atoms/cm$^2$. Buried layer 16 is preferably an n-type region doped by either an ion implantation process, or a diffusion process, to a doping concentration of about $5\times10^{18}$ to $5\times10^{19}$ atoms/cm$^2$.

Figure 5:
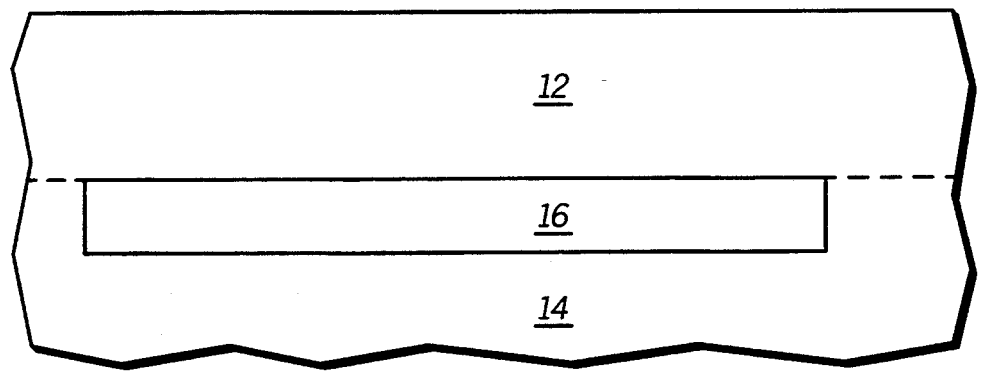

Following the formation of buried layer 16, a device layer 12 is formed overlying buried layer 16 and buried region 14, as illustrated in FIG. 5. Preferably, device layer 12 is formed by an epitaxial deposition process to a thickness of about 1 micron. During the epitaxial deposition process, device layer 12 is boron doped to have a p-type conductivity with a boron dopant concentration of about $1\times10^{15}$ to $1\times10^{16}$ atoms/cm$^2$. Alternatively, device layer 12 can be doped after epitaxial deposition by using either an ion implantation or a diffusion process. In a further alternative embodiment, the structure illustrated in FIG. 5 can be formed in a single-crystal semiconductor substrate having a thickness equal to that of regions 12 and 14. In the alternative embodiment, buried layer 16 is formed by a high-energy ion implantation process, in which phosphorous or arsenic atoms are implanted to a depth of about 1 micron in the single-crystal substrate. Following the implantation process, the substrate is annealed to activate the implanted dopant atoms.

Figure 6:
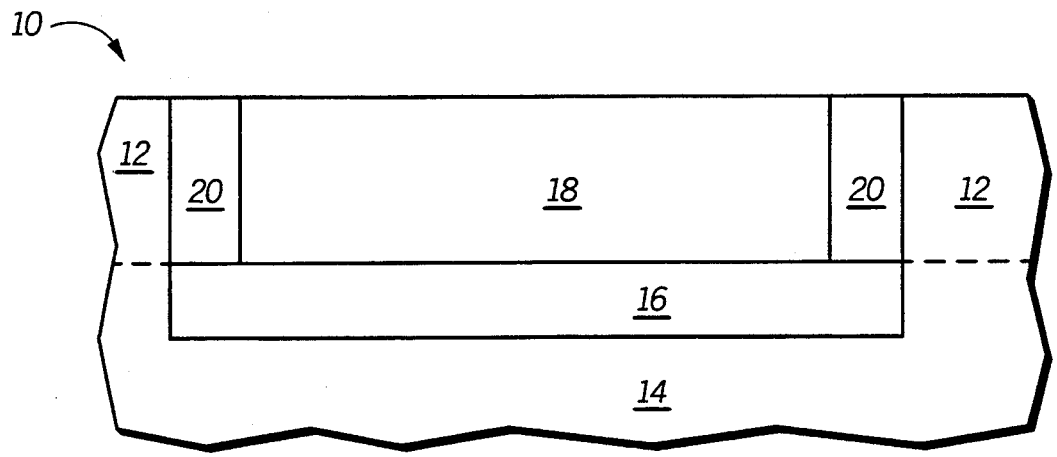

The process continues, as illustrated in FIG. 6, with the formation of isolation region 20. Isolation region 20 extends from buried layer 16 to the surface of device layer 12, and electrically isolates well region 18 from remaining portions of substrate 10. Isolation region 20 is formed by either a diffusion process or an ion implantation process in which an n-type dopant, such as arsenic or phosphorous, is introduced into device layer 12. The n-type dopant is introduced through a doping mask formed on the surface of device layer 12 prior to introducing dopant atoms. The doping mask (not shown) is aligned to the perimeter of buried layer 16, such that isolation region 20 and buried layer 16 form a continuous n-type region enclosing well region 18, and separating well region 18 from remaining portions of substrate 10.

Figure 7:
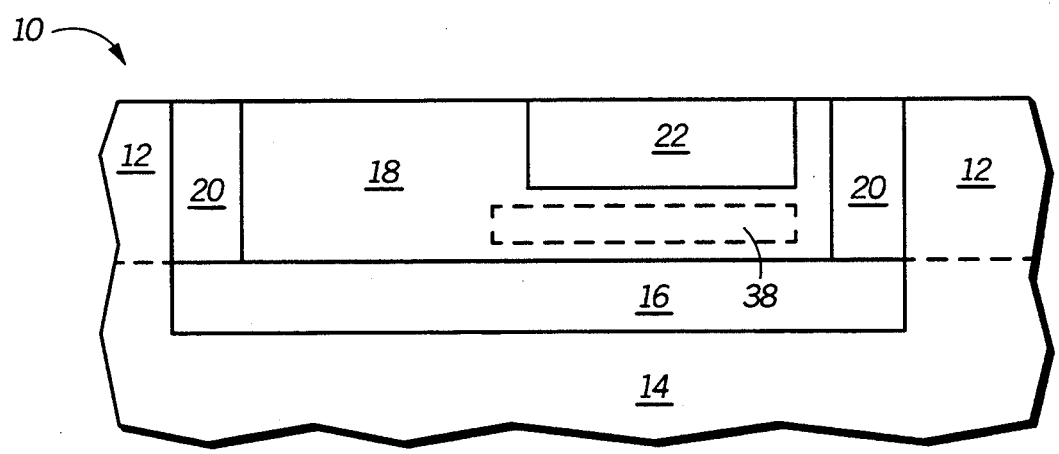

Next, a base region 22 is formed in well region 18, as illustrated in FIG. 7. Base region 22 is preferably formed by introducing phosphorus atoms into well region 18 by either ion implantation or diffusion. Preferably, base region 22 is formed to a depth of about 0.5 microns in well region 18, and contains a phosphorus doping concentration of about $1\times10^{16}$ to $5\times10^{18}$ atoms/cm$^2$.

In order to reduce the series resistance of the JFET channel region underlying base region 22, a p-type buried layer 38 can optionally be formed in well region 18 beneath base region 22. Buried layer 38 is preferably formed by the ion implantation of boron-atoms at high energy, such that the boron atoms are concentrated in well region 18 between base region 22 and buried layer 16. Buried layer 38 can improve the performance of JFET 36, by increasing the current conduction capability in the channel region of the JFET.

Figure 8:
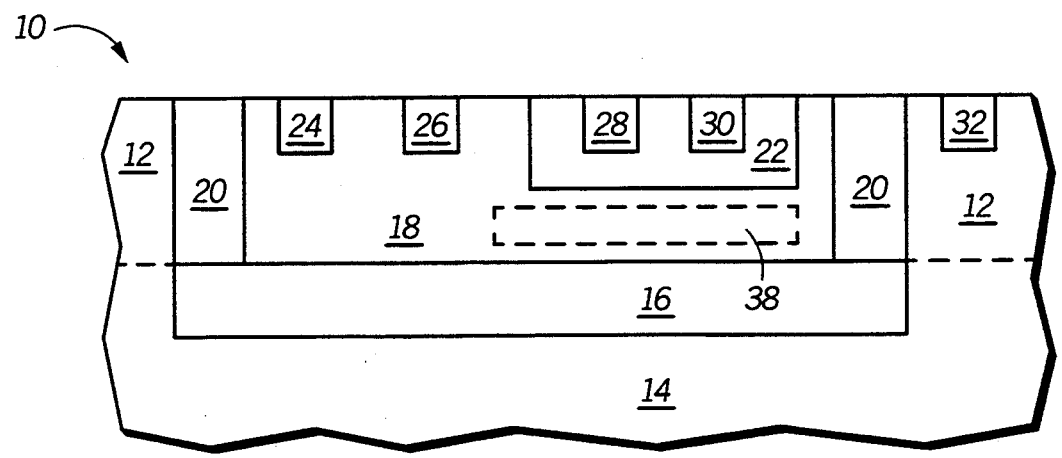

After forming base region 22, as illustrated in FIG. 8, source region 24 and doped region 28 are formed by introducing boron atoms into precise locations within well region 18 and base region 22. Preferably, source region 24 and doped region 28 are formed by introducing boron atoms to a concentration of about $1\times10^{19}$ to $1\times10^{20}$ atoms/cm$^2$. Doped region 28 serves as an emitter region for bipolar transistor 34. Additionally, a p-type substrate contact 32 is formed in device layer 12 residing wholly outside of well region 18 and separated therefrom by isolation region 20. Finality, phosphorous or arsenic atoms are introduced into well region 18 and base region 22 to form a gate region 26, and a base contact 30. Preferably, the n-type regions are formed by doping predefined portions of well region 18 and base region 22 with phosphorous or arsenic to a concentration of about $1\times10^{19}$ to $1\times10^{20}$ atoms/cm$^2$. As illustrated in FIG. 1, gate region 26 spans well region 18 and joins isolation region 20 to form a continuous n-type region in device layer 12.

The fabrication of the voltage controlled resistive device of the invention is completed by carrying out further processing steps to electrically isolate the device, and to provide electrical interconnection of the device with other components of an integrated circuit. To provide electrical isolation, a passivation layer (not shown) is formed on the surface of device layer 12 by either a chemical vapor deposition process, or by thermal oxidation. The passivation layer is photolithographically patterned and etched to form contact openings to the terminals of the voltage controlled resistive device, and a metal deposition process is performed to provide electrical interconnects to the terminal regions. Additionally, other processes can be carried out to add further passivation, and additional metal interconnect layers can be formed for the fabrication of multi-level interconnect structures.

Thus it is apparent that there has been provided, in accordance with the invention, a voltage controlled resistive device which fully meets the advantages set forth above. Although the invention has been described and illustrated with reference to specific illustrative embodiments thereof, it is not intended that the invention be limited to those illustrative embodiments. Those skilled in the art will recognize that variations and modifications can be made without departing from the spirit of the invention. For example, the JFET and the bipolar transistor can include contact electrodes comprised of a patterned semiconductor material, and formed on the surface of the device layer. Additionally, dopant diffusion and ion implantation processes can carried out through a dielectric layer overlying the surface of the device layer. It is therefore intended to include within the invention all such variations and modifications as fall within the scope of the appended claims and equivalents thereof.

I claim:

1. A semiconductor device comprising:
   a substrate having a device layer of a first conductivity type overlying a buried region, the device layer having a surface;
   a buried layer of a second conductivity type intermediate to the device layer and the buried region;
   a well region of the first conductivity type residing within the device layer and separated therefrom by an isolation region of the second conductivity type, wherein the isolation region extends from the buried layer to the surface of the device layer;

a base region of the second conductivity type residing within the well region;

a source region of the first conductivity type residing within the well region and separated from the base region by a gate region of the second conductivity type, wherein the gate region is integral with the isolation region; and a doped region of the first conductivity type residing within the base region, wherein the doped region functions as an emitter region.

2. The device of claim 1 further comprising a base contact region of the second conductivity type residing within the base region and a substrate contact of the first conductivity residing within the device layer and outside of said well region.

3. A semiconductor device comprising:

a substrate having a device layer of a first conductivity type overlying a buried region, the device layer having a surface;

a well region residing within the device layer;

an isolation region of the second conductivity type extending from the buried layer to the surface of the device layer separating the well region from the surface of the device layer;

a vertical bipolar transistor having a base region residing within the well region and a first buried layer of a second conductivity type residing in the buried region; and a junction field effect transistor residing within the well region, wherein the well region functions as both a drain region for the junction field effect transistor, and as a collector region for the bipolar transistor, and wherein the junction field effect transistor further comprises a gate region residing within the well region, wherein the gate region is integral with the isolation region.

4. The device of claim 3 further comprising a base contact region residing within the base region and a substrate contact region residing within the device layer and outside of said well region.

5. The device of claim 4 further comprising a second buried layer of a first conductivity type intermediate to the base region and the first buried layer.

6. A semiconductor device comprising:

a semiconductor substrate having a device layer overlying a buried region;

an isolation region in the device layer having a plurality of sides and forming a first perimeter;

a base region in the device layer having a second perimeter within the first perimeter;

a source region within the first perimeter;

a gate region within the first perimeter extending from one of the plurality of sides of the isolation region and separating the source region from the base region, wherein a channel region resides within the first perimeter and below the gate region; and an emitter region within the second perimeter, wherein the emitter region is electrically coupled to the source region by the channel region and by the base region.

7. The device of claim 6 further comprising a buried layer residing in the buried region and contacting the isolation region at the first perimeter.

8. The device of claim 6 further comprising a base contact region within the base region.

* * * * *